United States Patent
Savvopoulos et al.

(10) Patent No.: US 9,826,309 B2
(45) Date of Patent: Nov. 21, 2017

(54) OPTIMISED LOUDSPEAKER OPERATION

(71) Applicants: Dialog Semiconductor (UK) Limited, London (GB); Dialog Semiconductor B.V., s-Hertogenbosch (NL)

(72) Inventors: Panayiotis Savvopoulos, Rio-Patras (GR); Konstantinos Chatzis, Patras (GR)

(73) Assignees: Dialog Semiconductor (UK) Limited, Reading (GB); Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 15/047,968

(22) Filed: Feb. 19, 2016

(65) Prior Publication Data
US 2016/0249135 A1 Aug. 25, 2016

(30) Foreign Application Priority Data
Feb. 20, 2015 (DE) .................. 10 2015 002 009

(51) Int. Cl.
| | |
|---|---|
| H03G 11/00 | (2006.01) |
| H04R 3/00 | (2006.01) |
| H04R 3/04 | (2006.01) |
| H04R 29/00 | (2006.01) |
| H03G 5/16 | (2006.01) |
| H03F 1/52 | (2006.01) |

(52) U.S. Cl.
CPC .............. *H04R 3/007* (2013.01); *H04R 3/04* (2013.01); *H03F 1/52* (2013.01); *H03F 2200/426* (2013.01); *H03F 2200/447* (2013.01); *H03G 5/165* (2013.01); *H04R 29/001* (2013.01)

(58) Field of Classification Search
CPC ........ H04R 3/007; H04R 3/04; H04R 29/001; H03G 5/165; H03F 1/52; H03F 2200/426; H03F 2200/447
USPC ....................... 381/55, 58–59, 103
See application file for complete search history.

(56) References Cited

U.S. PATENT DOCUMENTS

| | | | | |
|---|---|---|---|---|
| 5,815,585 | A * | 9/1998 | Klippel .............. | H03H 21/0001 381/59 |
| 6,940,981 | B2 * | 9/2005 | Neunaber ................ | H03F 1/52 330/254 |
| 8,023,668 | B2 * | 9/2011 | Pfaffinger ............ | H04R 29/001 381/164 |
| 8,538,040 | B2 * | 9/2013 | Kirn ....................... | H04R 3/007 381/120 |
| 8,542,840 | B2 * | 9/2013 | Manninger ............. | H03F 3/181 381/103 |
| 8,571,233 | B2 * | 10/2013 | Kikugawa .............. | H03G 5/005 381/103 |
| 9,226,071 | B2 * | 12/2015 | Polleros ................. | H04R 3/007 |

(Continued)

FOREIGN PATENT DOCUMENTS

WO WO2014045123 3/2014

*Primary Examiner* — Disler Paul
(74) *Attorney, Agent, or Firm* — Saile Ackerman LLC; Stephen B. Ackerman

(57) ABSTRACT

An optimised method for driving a loudspeaker is used for protecting the loudspeaker from damage due to excessive excursion or from overheating. The playback power of an incoming audio data stream is compared with a feedback power derived from the loudspeaker actuator and the comparison is used to adjust the frequency response of the loudspeaker, across individual sub bands.

20 Claims, 12 Drawing Sheets

(56) References Cited

U.S. PATENT DOCUMENTS

| | | | |
|---|---|---|---|
| 2005/0163324 A1* | 7/2005 | Neunaber | H03F 1/52 |
| | | | 381/55 |
| 2007/0217625 A1* | 9/2007 | Bai | H04R 3/002 |
| | | | 381/96 |
| 2012/0106750 A1 | 5/2012 | Thormundsson et al. | |
| 2013/0251164 A1* | 9/2013 | Gautama | H04R 29/001 |
| | | | 381/59 |
| 2013/0329894 A1* | 12/2013 | Krishnaswamy | H03G 11/00 |
| | | | 381/55 |
| 2013/0329898 A1 | 12/2013 | Williams et al. | |
| 2014/0169571 A1* | 6/2014 | Polleros | H04R 3/007 |
| | | | 381/55 |
| 2014/0341388 A1 | 11/2014 | Goldstein et al. | |
| 2015/0237444 A1* | 8/2015 | Kiadeh | H04R 3/04 |
| | | | 381/103 |

* cited by examiner

OPTIMISED LOUDSPEAKER OPERATION

TECHNICAL FIELD

The present disclosure relates to optimised loudspeaker operation, and in particular to methods and apparatus for controlling or adjusting the frequency response of a loudspeaker.

BACKGROUND

A loudspeaker is a transducer which converts an electrical signal into sound. Audio data is amplified to drive an actuator which moves a diaphragm member back and forth to produce sound waves. In a typical dynamic loudspeaker the actuator is a voice coil and the diaphragm element is a cone or membrane.

If a loudspeaker is excited at power levels which are too high, the excursion of the diaphragm member can be greater than it is designed for and it can become damaged. Loudspeakers can also be damaged by overheating of the actuator, diaphragm member or other elements.

These problems are especially acute in the example of loudspeakers of mobile devices, such as cell phones, tablet computers, laptops and the like. Mobile devices may come into contact with a number of different surfaces formed of different materials, and are generally subject to harsh and unpredictable stresses as they are stored in pockets or bags, and used in a variety of indoor and outdoor environments.

Furthermore, there are strict design constraints that effect loudspeaker designs for mobile devices. The loudspeakers have to be small in area, but also to be very thin and to provide a high sound level. These are difficult criteria to reconcile, and so the loudspeakers of a mobile device tend to operate close to their performance limits and are prone to damage by overexcursion or overheating.

The frequency response of a loudspeaker is also subject to manufacturing tolerance and drift due to aging, external shocks and environmental conditions such as dust and humidity.

A changing or unpredictable frequency response poses several problems. The accurate reproduction of sound may be compromised because equalization of the sound across frequency bands does not operate as expected. Also, a loudspeaker may be more prone to damage by overexcursion or overheating if the frequency response is altered.

SUMMARY

There is a need to protect loudspeakers from damage, and to generally improve control of a loudspeaker's frequency response.

According to a first aspect of the disclosure there is provided a loudspeaker driver circuit containing first power calculation module for determining a playback power from incoming audio data, a second power calculation module for determining a feedback power from an actuator for driving the loudspeaker and decision logic for comparing the playback and feedback powers and generating a command for adjusting a frequency response of the loudspeaker based on the comparison.

Optionally, the actuator comprises an amplifier.

Optionally, the loudspeaker driver circuit comprises an equalizer which controls the actuator, and the generated command comprises a gain factor or an attenuation factor for the equalizer.

Optionally, the first and second power calculation modules are arranged to determine playback power and feedback power for one or more specific frequency sub bands. The frequency response of the loudspeaker is adjusted for each individual sub band.

Optionally, the loudspeaker driver circuit comprises a buffer for storing one or more playback and feedback power comparison results, and the decision logic uses the stored results in combination with a later comparison result as the basis for adjusting the frequency response of the loudspeaker.

Optionally, the first power calculation module comprises a power spectral density function calculator.

Alternatively, the first power calculation module comprises one or more band pass filters for extracting frequency content and a transformation module for transforming the frequencies to provide a power measurement for the or each frequency band.

Optionally, the second power calculation module comprises a measurement device for measuring a current and a voltage across terminals of the actuator; and a calculator for multiplying the measured values to obtain a power measurement.

Optionally, the second power calculation module comprises a set of band pass filters for filtering the current and/or voltage measurements taken by the measurement device.

Optionally, the playback power is smoothed before being compared with the feedback power.

Optionally, the feedback power is smoothed before being compared with the playback power.

Optionally, the loudspeaker is determined as being in an excursion condition if the feedback power is relatively high for one or a set of relatively low frequency sub bands.

Optionally, the loudspeaker is determined as being in an overheating condition if the feedback power is relatively low for one or a set of relatively high frequency sub bands.

Optionally, a first comparison threshold is defined for monitoring a loudspeaker excursion condition. A second comparison threshold is defined for monitoring a loudspeaker overheating condition. A first control signal adjusts the frequency response of a first set of frequency bands in response to the monitoring of the first comparison threshold. A second control signal adjusts the frequency response of a second set of frequency bands in response to the monitoring of the second comparison threshold.

Optionally, the first comparison threshold is greater than the second comparison threshold.

Optionally, a first processor is provided for protection from loudspeaker excursion conditions and a second processor is provided for protection from loudspeaker overheating conditions. Each of the first and second processors compares the playback and feedback powers for different frequency bands.

According to a second aspect of the disclosure there is provided a method of operating a loudspeaker comprising determining a playback power from incoming audio data, determining a feedback power from an actuator that drives the loudspeaker, comparing the playback and feedback powers and adjusting a frequency response of the loudspeaker based on the comparison.

Optionally, the actuator comprises an amplifier.

Optionally, adjusting a frequency response of the loudspeaker comprises applying a gain factor or an attenuation factor to an equalizer which provides a command signal for the actuator.

Optionally, comparing the playback and feedback powers comprises calculating a ratio of the powers.

Optionally, the playback power and feedback power are determined for a specific frequency sub band and the frequency response of the loudspeaker is adjusted for that sub band.

Optionally, a plurality of sub bands are monitored and individually adjusted based on the comparisons made for each sub band.

Optionally, one or more results of comparing the playback and feedback powers are stored and used in combination with a later result of comparing the playback and feedback powers as the basis for adjusting the frequency response of the loudspeaker.

Optionally, determining a playback power from incoming audio data comprises calculating a power spectral density function.

Alternatively, determining a playback power from incoming audio data comprises extracting the frequency content with one or more band pass filters and transforming the frequencies to provide a power measurement for the or each frequency band.

Optionally, determining a feedback power from an actuator comprises measuring a current and a voltage across terminals of the actuator; and multiplying the measured values to obtain a power measurement.

Optionally, measuring a current and/or a voltage across terminals of the actuator comprises extracting frequency content with one or more band pass filters which isolate and extract the desired frequency content of one or more frequency bands.

Optionally, the playback power is smoothed before being compared with the feedback power.

Optionally, the feedback power is smoothed before being compared with the playback power.

Optionally, the loudspeaker is determined as being in an excursion condition if the feedback power is relatively high for one or a set of relatively low frequency sub bands.

Optionally, the loudspeaker is determined as being in an overheating condition if the feedback power is relatively low for one or a set of relatively high frequency sub bands.

Optionally, a first comparison threshold is defined for monitoring a loudspeaker excursion condition, a second comparison threshold is defined for monitoring a loudspeaker overheating condition. A first control signal adjusts the frequency response of a first set of frequency bands in response to the monitoring of the first comparison threshold. A second control signal adjusts the frequency response of a second set of frequency bands in response to the monitoring of the second comparison threshold.

Optionally, the first comparison threshold is greater than the second comparison threshold.

Optionally, a first processor is provided for protection from loudspeaker excursion conditions and a second processor is provided for protection from loudspeaker overheating conditions; where each of the first and second processors compares the playback and feedback powers for different frequency bands.

BRIEF DESCRIPTION OF THE DRAWINGS

The disclosure will be described below, by way of example only, with reference to the accompanying drawings, in which.

DESCRIPTION

Figure 1:
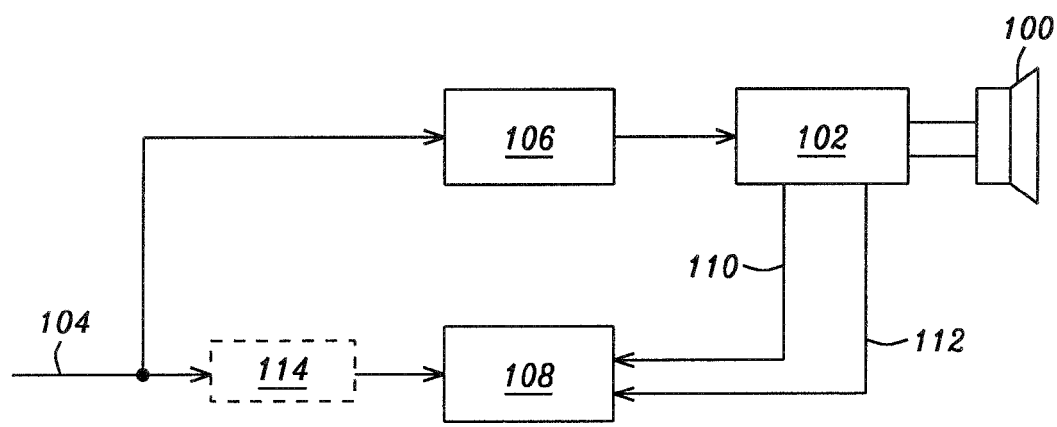
FIG. 1 shows an overview of a system for optimised loudspeaker operation according to an embodiment of the disclosure.

An overview of a loudspeaker driver circuit according to an embodiment of the disclosure is shown in FIG. 1. A loudspeaker 100 is driven by an actuator 102, which is usually a voltage amplifier such as a Class D amplifier, but can be any other type of actuator from which voltage and current measurements can be obtained. Audio data 104 comprising a stream of digital audio samples is input to an equalizer 106 which provides equalized audio data to the amplifier 102. The equalizer 106 processes the audio data in order to adjust the frequency response of the loudspeaker in a plurality of frequency bands. In an ideal case the actual frequency response of the loudspeaker 100 will be precisely defined by the processing performed by the equalizer. However in practice the actual frequency response of the loudspeaker 100 may vary from the expected or desired values.

The system of the present disclosure monitors the actual power level of the amplifier driving the loudspeaker and adjusts the operation of an equalizer in order to optimise the operation of the loudspeaker.

A processor 108, which may be a digital signal processing unit, receives feedback power measurements from the actuator 102. The feedback power measurements may suitably comprise a current measurement 110 and a voltage measurement 112 taken from the actuator 102, with the processor 108 calculating the product of the current and voltage to determine the power. The actuator 102 may alternatively provide a single power reading to the processor rather than separate current and voltage measurements. It is also to be appreciated that determining the feedback power may comprise measuring either current or voltage and using an assumed or otherwise derived value for the other of current or voltage to determine the power.

The processor 108 also receives audio data 104 and determines a playback power measurement, namely, the power of the audio data that is about to be sent to the loudspeaker for sound reproduction. The processor compares the playback and feedback powers, for example by determining the ratio between playback and feedback power levels, and adjusts the operation of the equalizer 106 using the results of that comparison. The adjustment of the equalizer 106 may also make use of other information.

The playback and feedback power measurements and the comparison of the measured powers may be made at the various different frequency bands, and a corresponding equalizer adjustment can be made to adjust the power of each frequency band that drives the loudspeaker 100.

It is also possible as an option to include a delay circuit 114 such as a digital delay line, in order to ensure synchronicity of operation.

Figure 2:
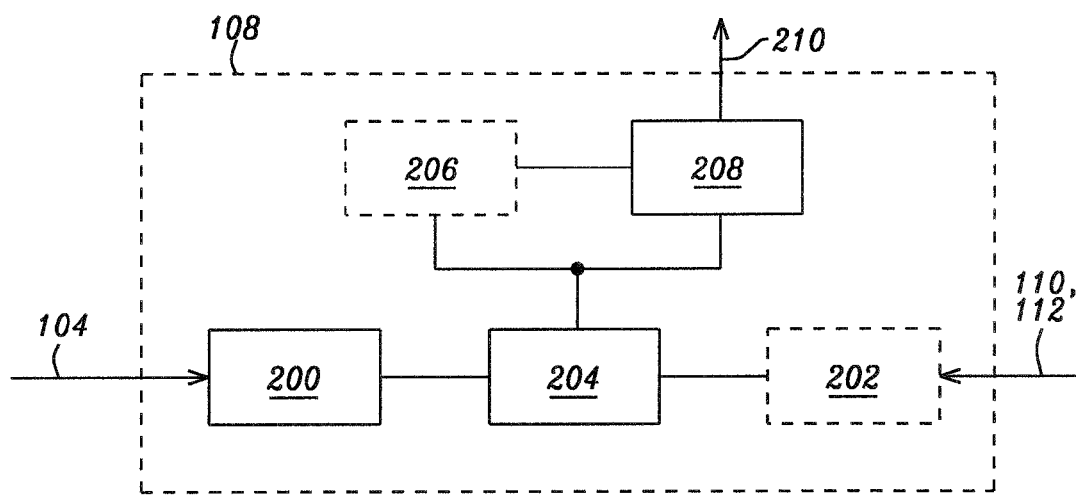
FIG. 2 shows an embodiment of a processor that can be used with the system of FIG. 1.

FIG. 2 shows an embodiment of a processor 108 that can be used with the system of FIG. 1. The processor receives audio data 104 and a first power calculation module 200 derives a playback power. The processor also receives current and voltage measurements 110, 112 from the actuator 102 and a second power calculation module 202 derives a feedback power. The second power calculation module 202 is optional, and can be omitted in embodiments where the amplifier provides the power reading directly. The first and second power calculation modules 200, 202 comprise circuits which process the received data to derive the relevant power.

A comparison module 204 receives the playback and feedback powers from the first power calculation module 200 and from the second power calculation module 202 (or directly from the amplifier), and calculates a comparison metric which provides a measure of the relationship between the playback and feedback powers. In one embodiment the comparison metric is a ratio of the powers, or a measure derived therefrom.

In optional embodiments, a filter module is provided to smooth variation in the power measurements. The smoothing can take the form of some appropriate statistical function, such as a moving average. When included, a filter module can be provided for smoothing out either or both of the playback and feedback power measurements. A filter module can be provided as a standalone component, or it may be a component of a power calculation module 200, 202, or it may be a component of the comparison module 204. When filter modules are provided, the comparison module 204 receives the smoothed playback and feedback powers and calculates a comparison metric based on the smoothed values.

A control module 208 then receives the output of the comparison module 204 and based on the comparison metric and optionally on other factors, generates a command for adjusting the frequency response of the loudspeaker. Its output 210 may comprise gain or attenuation adjustments to be applied. The comparison module 204 and control module 208 together form a decision logic that compares the playback and feedback powers and generates a command for adjusting a frequency response of the loudspeaker based on the comparison that it makes.

The control module is in preferred embodiments an equalizer control module 208 that determines a set of power ratios for equalizer control. Its output 210 is provided to the equalizer 106 to determine the power levels that are applied to a plurality of frequency bands that drive the loudspeaker 100. The output 210 may comprise gain or attenuation adjustments for each applicable frequency band, to be applied by the equalizer.

In optional embodiments, a memory 206 is provided which is used to store past outputs of the comparison module 204. When the equalizer control module 208 receives a new output from the comparison module 204 it uses the newly received comparison metric in combination with a number of historical values stored in the memory 206 in order to derive the output 210 for the equalizer.

Figure 3:
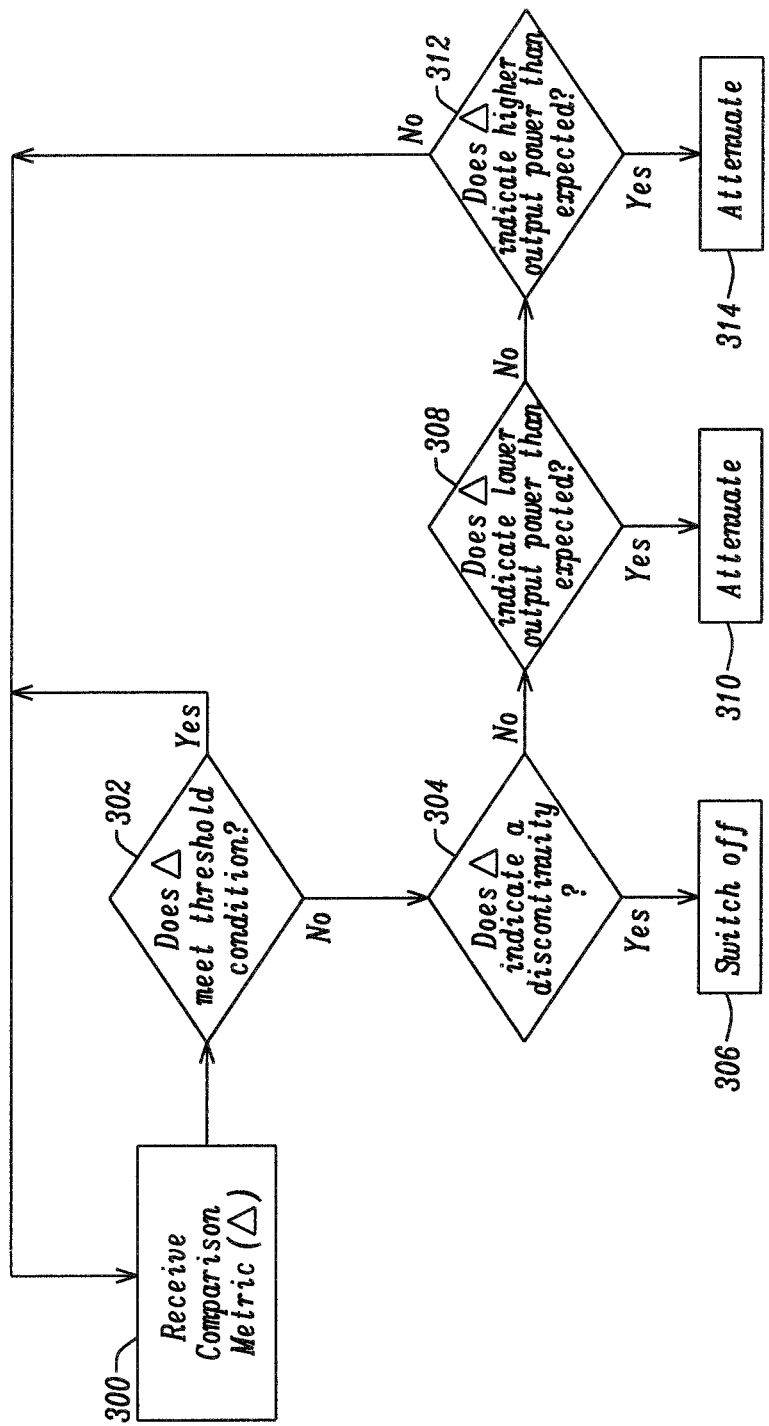
FIG. 3 shows an example process by which a equalizer control module determines its output.

FIG. 3 shows an example process by which the equalizer control module 208 determines its output 210. At step 300 a comparison metric A is received. At step 302, the comparison metric is compared to a threshold condition. A comparison is made for each frequency band. The threshold condition is designed to identify whether a change in the input power has an expected effect on the output power. If the difference is within permitted limits then no further action is taken and the output 210 will not modify the power levels applied to each band by the equalizer. However if the threshold condition is not met, it is determined that the speaker is in extreme conditions such as excursion, overheating, or has been partially damaged. These conditions can be determined for a plurality of frequency bands. When one of the conditions is identified, action is taken to define an output signal 210 that will modify the appropriate bands of the equalizer.

At step 304, the comparison metric is assessed to determine if it indicates a discontinuity in the power levels, which may for example occur if the feedback power drops suddenly to near zero. In that case, the relevant bands can be switched off (step 306). If there is no discontinuity, then the comparison metric is tested at step 308 to determine if the feedback power is lower than expected, by comparison with a first threshold. If so, the relevant frequency band can be attenuated (step 310). Similarly, the comparison metric is tested at step 312 to determine if the feedback power is higher than expected, by comparison with a second threshold. If so, the relevant frequency band can be attenuated (step 314). Note that the order of the comparisons 304, 308, 312 is not limited to the sequence shown in FIG. 3.

A discontinuity is indicative of a (partially) damaged speaker and so damaged frequency bands should not be driven at all to avoid further speaker damage. For relatively low frequencies, if the output power is higher than expected it can be determined that the speaker is suffering from excursion. For medium to high frequencies, if the output power is lower than expected it can be determined that the speaker is overheating. The thresholds that define low, medium and high frequencies can be defined arbitrarily.

Figure 4:
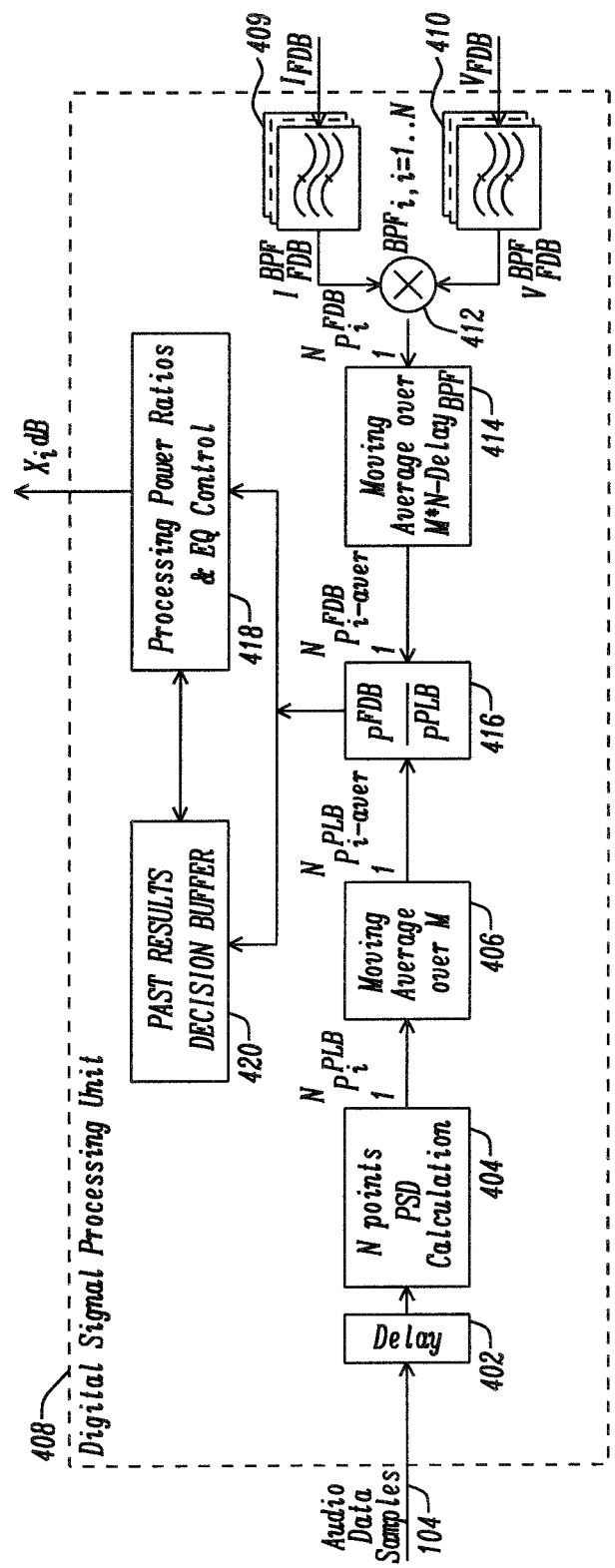
FIG. 4 shows a further embodiment of a processor that can be used with the system of FIG. 1.

FIG. 4 illustrates an example embodiment of a processor 408, which may be used as the processor 108 of FIG. 1. The processor 408 is supplied with the current $I_{FDB}$ (where FDB stands for feedback) and voltage $V_{FDB}$ measurements along with the audio data samples 104, which have the same sampling rate $F_S$ as the current and voltage measurements. The audio data samples comprise the signal waveform that is about to be transferred to the loudspeaker for playback. The data samples 104 correspond to the voltage that is finally generated by an audio codec at the end of the loudspeaker voice coil. From these inputs the processing unit 408 is able to calculate the playback and feedback power levels, optionally for each of the N different frequency bands constituting the loudspeaker's operational frequency range. The number of frequency bands, N, depends on the loudspeaker/equalizer design and can be any arbitrary value according to the present disclosure.

Following the comparison between the power levels, the processor 408 can derive information about the difference for each frequency band, relate it with history of previous states and decisions and subsequently drive the N-band equalizer.

According to the values received from the processor 408, the equalizer changes the power level for the respective frequency band i, where i=1 . . . N. The playback signal may also be delayed using digital delay line 402 or a suitable equivalent, so that it is synchronised with the equalizer state that is determined based on the same part of the audio content as the one being processed by the equalizer.

A first power calculation module derives the playback power (or digital power) $Pi^{PLB}$ (where PLB stands for "playback"), i=1 . . . N for the N frequency bands, and in this embodiment comprises circuitry 404 providing an N point Power Spectral Density (PSD) function based on the processing of N samples that generates N values for the N frequency bands. The number N can vary according to the desired resolution in controlling the speaker's operational frequency range and the available processing power.

An optional filter module 406 can average these values over M times in order to yield the averaged playback power value $P_{i\text{-}aver}^{PLB}$. This can be achieved by providing an averaging filter.

The input audio signal used for the power calculation is firstly delayed (by delay line 402) in order to be aligned with the respective readings of voltage and current ($I_{FDB}/V_{FDB}$). The delay that is applied will depend on the voltage amplifier providing the latter measurements.

A second power calculation module comprises band pass filters 409, 410 and a multiplier 412. It derives the feedback output power $P_i^{FDB}$, i=1 . . . N for the N frequency bands from the measured current and voltage values $I_{FDB}$ and $V_{FDB}$ over loudspeaker terminals. Both values can be initially filtered by N different band pass filters (BPF) 409, 410 in order to isolate and extract the frequency content of the desired frequency band. The filtered values $I^{BPF}_{FDB}$ and $V^{BPF}_{FDB}$ can then be multiplied providing the instantaneous real power $P_i^{FDB}$, i=1 . . . N, where N the number of frequency bands.

An optional filter module 414 can average these values over (M*N)–Delay$_{BPF}$ times in order to yield an averaged feedback power $P_{i\text{-}aver}^{FDB}$, i=1 . . . N, where Delay$_{BPF}$ corresponds to the delay of the band pass filters. This can be achieved by providing an averaging filter.

The use of these delay compensated data samples for the determination of the averaged feedback power is aiming to generate the needed power related results in synchronicity with the respective results of the playback power. The number of bandpass filters should coincide with the points of the PSD calculations present at the input.

A comparison module 416 is provided which calculates a ratio of the playback and feedback powers (or their moving average values) as a comparison metric. In this example the ratio is that of the feedback power to the playback power, $P^{FDB}:P^{PLB}$, although in alternative embodiments the inverse of this ratio or other measures derived from either ratio could be employed as a comparison metric.

The ratio of powers $P^{FDB}:P^{PLB}$ is provided as an input to an equalizer control module 418. However the ratio can also be stored in a buffer memory 420 to provide a historical reference for future measurements.

The equalizer control module 418 uses a received ratio along with one or more previous ratios and accordingly determines gain or attenuation adjustments ($X_i$, measured in dB) to be applied at the equalizer filter structure.

This ratio (which may or may not be modified by a historical reference) is used to detect variations of the ratio which can be caused by various factors including without limitation environmental conditions, aging, mechanical changes of the speaker enclosure. The variations can then be corrected for by making adjustments to the equalizer to achieve a desired audio quality.

Using this information, it is also possible to detect whether an increase (or decrease) of the input has an expected effect on the output (per frequency band) in order to identify whether the speaker is in extreme conditions (such as excursion/overheat/partial damage for each one of the frequency bands) or not. The expected effect may be a proportional response or some other characteristic depending on the type of amplifier and loudspeaker being used.

Relative peaks of the ratio at low frequencies can be associated with excursion conditions, while relative drops of the ratio at mid to high frequencies can be associated with overheating conditions. Additionally, values of the ratio close to zero can be associated to partial damages of the speaker. These represent discontinuities of the feedback power results in the relevant frequency range while significant playback power is present. Damaged frequency bands should be not driven at all.

Peaks should be suppressed through attenuation at the respective frequency band. Drops of power can be identified as regions where feedback power drops even when the playback power rises or stays stable. These corresponding frequency bands should be suppressed through application of an attenuation factor in the equalizer, since excess power is not transformed to sound pressure but heat.

Figure 5:
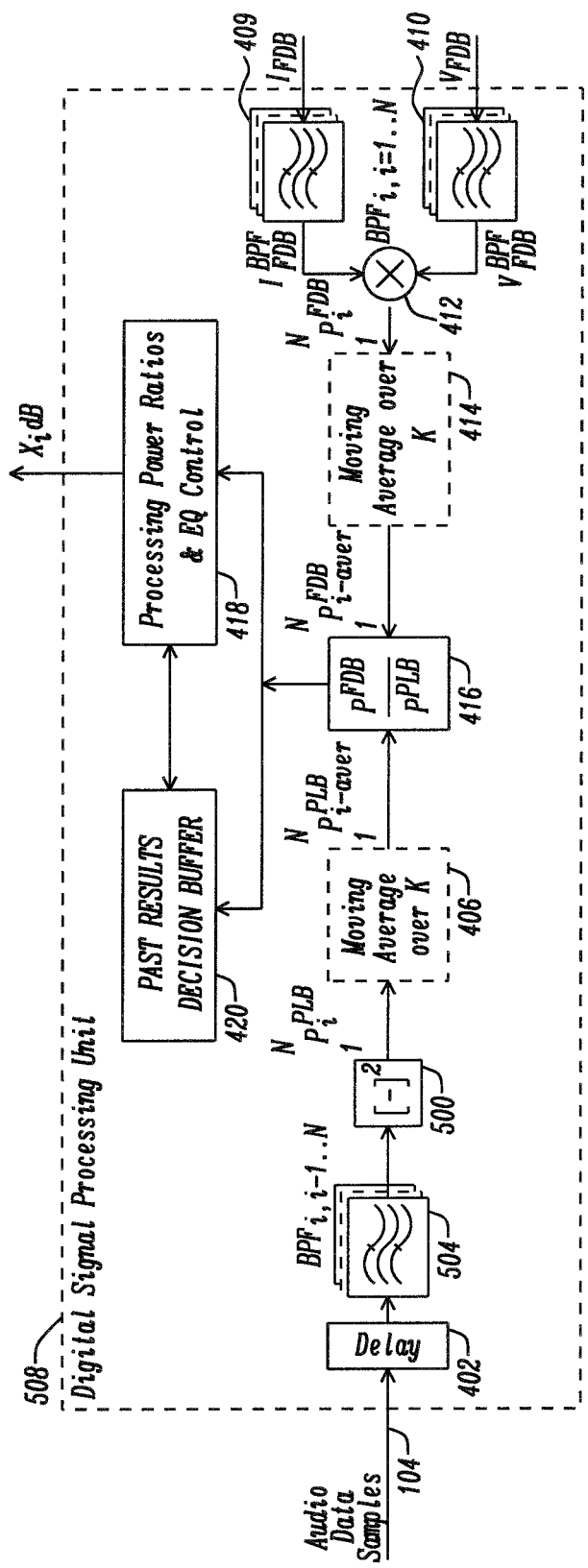
FIG. 5 shows a further embodiment of a processor that can be used with the system of FIG. 1.

FIG. 5 shows an alternative embodiment of a processing unit 508. This shares many similar components to those illustrated in FIG. 4, so the same reference numerals have been used to represent the corresponding components and their description will not be repeated for sake of brevity. However, in this embodiment the first power calculation module comprises a set of N bandpass filters (BPF) 504 that extract the frequency content of each band and a logic unit 500 that squares their outputs, to derive the playback power $Pi^{PLB}$ from the audio data 104. In the example (as illustrated) where similar or identical bandpass filters are applied at each of the playback and feedback sides' current and voltage measurements, a smoothing process of similar size can be used, here shown as similar moving averages over K samples which are employed by the optional filter modules 406, 414. This embodiment's response time is usually reduced compared to the embodiment of FIG. 4. This is largely because the filters' implementation is cheaper and simpler than the implementation of PSDs in both software and hardware platforms. In hardware implementations, the filters can run in parallel which means the playback side can have power calculations even sooner than in software implementations.

This is provided as an alternative option to the N point Power Spectral Density (PSD) function calculator 404 of FIG. 4, and can be selected when faster (real time) power calculations are needed, or when PSD calculations are not fast enough for the platform being used.

Figure 6:
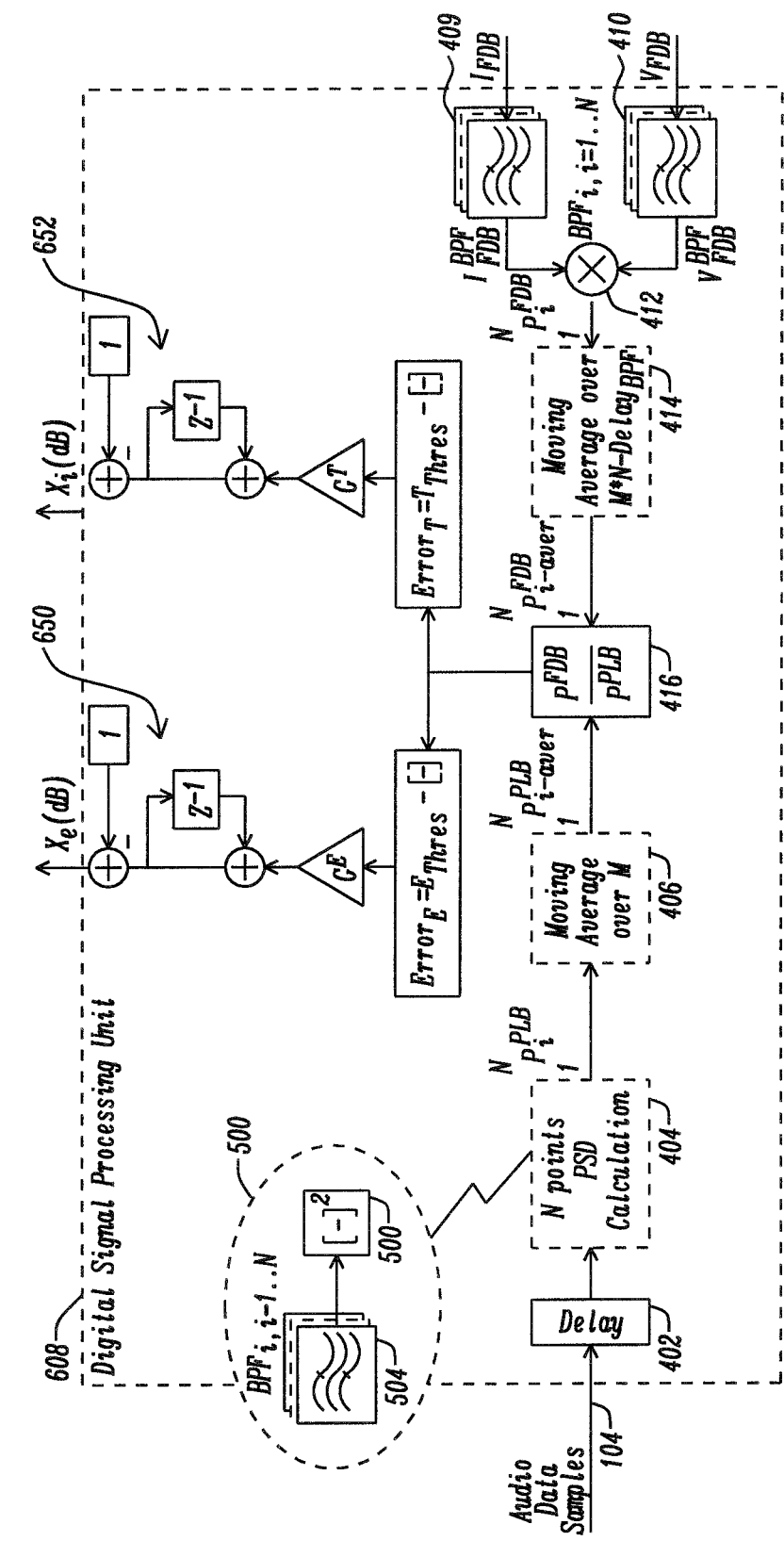
FIG. 6 shows an alternative embodiment of a processing unit, which supplies two different outputs, one indicating an excursion condition and one indicating an overheating condition.

FIG. 6 shows an alternative embodiment of a processing unit 608, showing the way the calculated ratios are used for deciding if excursion/overheating is present. Here, the processing unit supplies two different outputs, one indicating an excursion condition and one indicating an overheating condition. No memory unit is provided to store previous comparison metrics.

As seen with respect to the embodiment of FIG. 4, the averaged feedback and playback power levels can be compared using the ratio $P_i^{FDB}/P_i^{PLB}$. Excursion conditions mainly occur in the resonance frequency where a peak in the real power is located. On the other hand, when a speaker is being overheated the real power at its terminals decreases. This reduction is driven by the fact that DC resistance of the voice coil is increasing which pulls down the ratio: $P_{real}=I\cdot V=V^2/R$ since the voltage V between the amplifier and the speaker remains unchanged.

Two different ratio thresholds can be defined, splitting the N used sub-bands into three different groups. These may comprise an excursion threshold $E_{Thres}$ which is used to determine an excursion condition and an overheating threshold $T_{Thres}$ which is used to determine an overheating condition. When the comparison metric of the comparison module is the ratio $P_{FDB}:P_{PLB}$, then the excursion threshold is greater than the overheating threshold.

The values of the ratio corresponding to each of the N sub bands which are greater than the excursion threshold correspond to sub bands that include the peak of the real power where the resonance/excursion frequency lies. These sub bands are subject to an attenuation $X_e$ through the respective filters of the equalizer that can minimize or limit the distortion from excursion conditions. The attenuation value for a sub band of index i may be derived by a process that is fed with an excursion error signal $Error_E$ where $Error_E = E_{Thres} - (P_i^{FDB}/P_i^{PLB})$.

When the excursion error signal is less than zero, an iterative mechanism 650 with a positive gain value $G_E$ ($G_E > 0$) is used to determine the final gain or attenuation factor. When the excursion error is greater than or equal to zero, the iterative mechanism 650 releases the attenuation. The gain value $G_E$ can be selected according to the desired speed or quality of its convergence. The determined gain or attenuation value finally rests around a point. The aim is to have the specific band close to (ideally just below) the limit of excursion where the speaker operation is safe.

The sub-band ratio values that are less than the overheating threshold $T_{Thres}$ correspond to sub bands that are characterized by a significant increase in the temperature over a specific threshold. These sub bands are also subject to an attenuation $X_i$ by the respective filters in the equalizer structure. The attenuation value for a sub-band of index i may be derived by a process that is fed with the overheating error signal $Error_T$ where $Error_T = T_{Thres} - (P_i^{OUT}/P_i^{IN})$.

When the overheating error signal is greater than or equal to zero, an iterative mechanism 652 with a negative gain value $G_T$ ($G_T < 0$) is used to determine the final gain or attenuation factor. When the overheating error is less than zero ($Error_T < 0$), the iterative mechanism 652 releases the attenuation. The gain value $G_T$ can be selected according to the desired speed or quality of its convergence. As before, the determined gain or attenuation value finally rests around a point. The aim is to have the specific band close to (ideally just below) the limit of excursion where the speaker operation is safe.

The iterative mechanisms 650, 652 act to track the error behaviour and keep it at minimum levels. It is to be appreciated that the specific circuits shown are for illustration purposes and any type or structure of logic that can track the error can be used.

By reducing the power in sub-bands in this way, speaker overheating can be prevented. Because of this protection, the overall real power delivered to the loudspeaker can be increased giving a louder output sound. If the loudspeaker then begins to overheat, the power delivered can be reduced. However this is done for each individual sub-band so a casual listener will not normally be able to perceive a reduction in volume, except in rare cases of extreme overheating when many sub bands are affected.

The indices of the values that are over the overheating threshold $T_{Thres}$ and below the excursion threshold $E_{Thres}$ ($T_{Thres} < x < E_{Thres}$) correspond to sub-bands that do not contribute to any extreme condition such as excursion or overheating conditions. In this case, no gain or attenuation adjustments are output by the processor 608 and the equalizer 106 operates without modification.

Additionally, any of the threshold values may be different for different frequency bands. This gives the ability to adjust the overall electrical frequency response of the loudspeaker, for example to achieve different subjective sound effects. The thresholds selection will be strongly affected by the type and physical characteristics of the speaker used.

The final equalizer control values ($X_e$, $X_i$) and the audio data content can sequentially be fed into an N-band equalizer in order to perform power adjustments on this content over the N different frequency bands. The audio content may also be delayed in order to be synchronous with the equalizer settings yielded by the processing of the same part of the content. The equalizer may comprise N band pass filters with configurable gain. Afterwards, the equalized audio content is sent to the amplifier for playback at the loudspeaker.

The rate at which the playback and feedback powers are compared can be adjusted to achieve a desired balance between power efficiency (low rate of sampling) and responsiveness (high rate of sampling).

In an optional embodiment, different sub bands may have different duty cycles. As an example of this, because temperature will generally change relatively slowly over time, it is possible to pause or switch off the sampling of a set of sub bands of relatively medium to high frequencies for periods of time. As an alternative, the sampling of these bands could be carried out at a relatively lower frequency as compared with the other relatively low frequency bands. This produces a saving in processing burden (and therefore power consumption), at the expense of some responsiveness. However the low frequency sub bands can still be sampled all the time or at the normal higher rate in order to maintain responsiveness for excursion events, which can happen suddenly.

The cases where either playback or feedback power readings are not available or are at a significantly low level indicate an exceptional case. In such conditions, the method of the disclosure can be paused in order not to update the gain/attenuation factors for the respective band.

Figure 7:
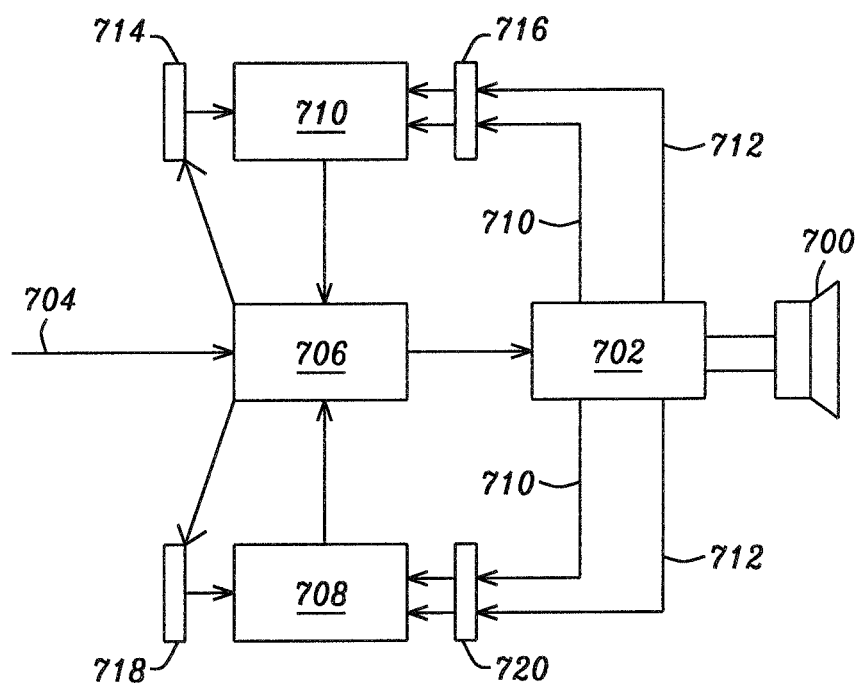
FIG. 7 shows an alternative embodiment of a loudspeaker protection system.

An overview of a loudspeaker protection system according to an alternative embodiment of the disclosure is shown in FIG. 7, which is similar to that of FIG. 1 except for the different arrangements of the processors and components which monitor playback and feedback power levels and adjusts the operation of an equalizer. A loudspeaker 700 is driven by an amplifier 702. Audio data 704 comprising digital audio samples is input to an equalizer 706 which provides equalised audio data to the amplifier 702.

A first processor 708 and a second processor 710 are provided, which each receive feedback power related measurements from the amplifier 702 and audio data 704 for the calculation of a playback power related measurement. The feedback power measurements may comprise a current measurement 710 and a voltage measurement 712 taken from the amplifier 702. The processors 708, 710 have frequency selection filters 714, 716, 718, 720 provided at their inputs which restrict the operation of the processors 708, 710 to selected frequency bands. The frequency selection filters 714, 716, 718, 720 may comprise low pass filters, high pass filters or band pass filters depending on the chosen frequency bands.

The processors 708, 710 compare the playback and feedback powers and provide an output for adjusting the operation of the equalizer 706 using the results of that comparison in a similar way to those processors described above, and may comprise the processors of any of FIGS. 1-6 or other embodiments described above. However having different processors each dedicated to a specific sub band means the loudspeaker protection system of FIG. 7 can be more computationally efficient as compared with the arrangement of FIG. 1, because only two bands are used, one lower frequency band is for excursion only and one band of moderate to high frequencies is for overheating only. This means that inputs to both processors 708, 710 are only processed according to a single threshold. The first processor 708 monitors to check if the ratio is higher than a threshold while the second processor 710 monitors to check if the ratio is below a limit. These outputs drive a two band equalizer 706. The advantage is that the bands are looking for peaks of the ratio in the first band and drops of the ratio in the second. It is to be appreciated that in a general case, N bands may be monitored by N dedicated processors. In order to provide loudspeaker protection, N should be a minimum of two.

The thresholds for the filters frequency selection filters 714, 716, 718, 720 can be chosen so that each of the processors 708, 710 is configured for the detection of different conditions. For example, one of the processors 708 or 710 can be used to compare the playback and feedback powers of a lower frequency band to determine when an excursion condition is occurring, while the other of the processors 708 or 710 can be used to compare the payback and feedback powers of a higher frequency band to determine when an overheating condition is occurring.

Figure 8:
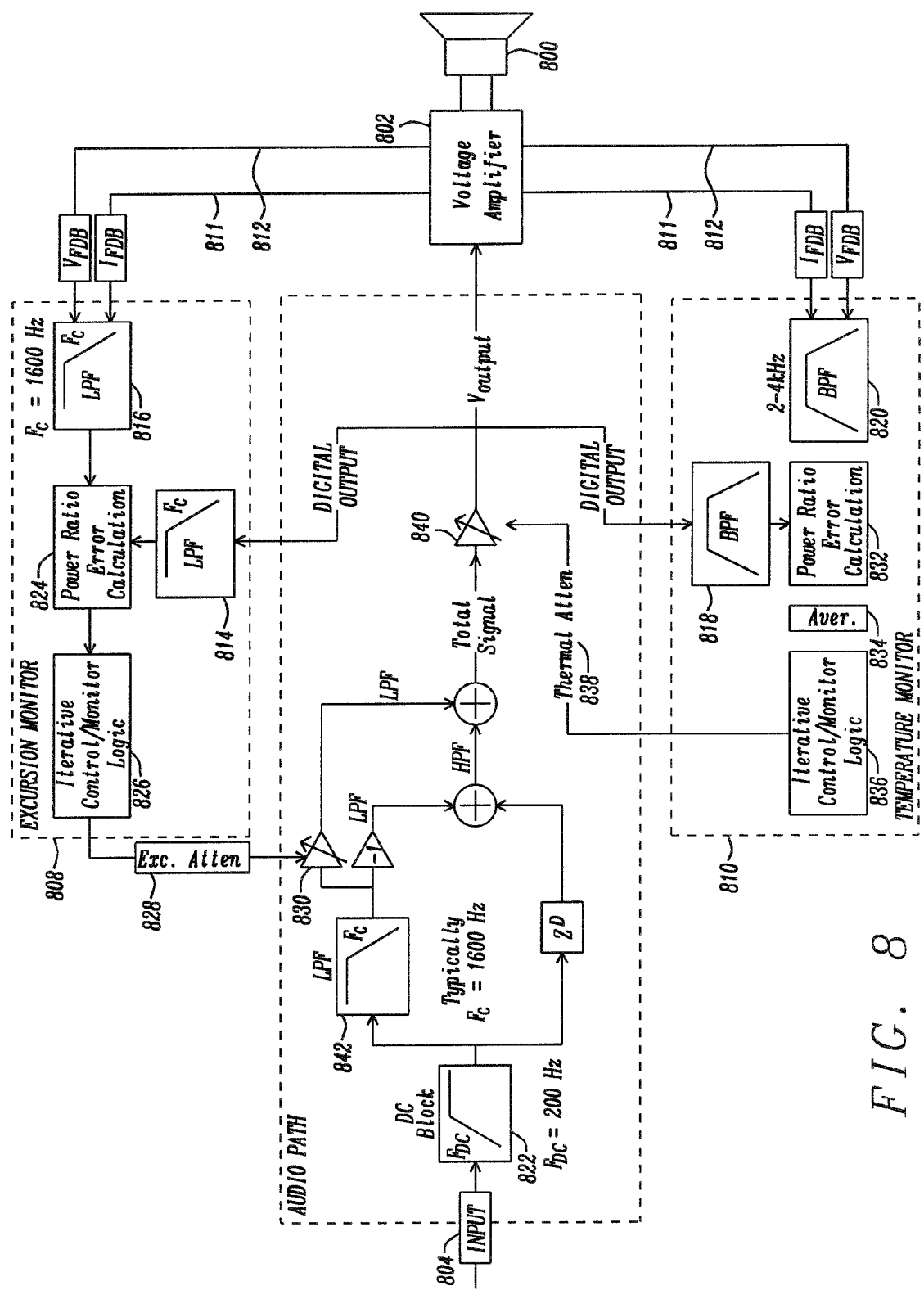
FIG. 8 shows a detailed example of a loudspeaker protection system that is constructed according to the principles set out in FIG. 7.

FIG. 8 shows one example of a loudspeaker protection system that is constructed according to the principles set out in FIG. 7. For the purposes of illustration we will refer to some specific values of frequency, current, voltage and other parameters although it will be appreciated that these values depend on the specific loudspeaker that is used and the disclosure is not limited to any specific set of parameter values.

In the system of FIG. 8, a first processor 808 acts as an excursion monitor and a second processor 810 acts as an overheating monitor.

The first processor 808 comprises a first low pass filter 814 that filters the digital output derived from the input audio data 804 and a second low pass filter 816 that filters the current and voltage measurements 811, 812 from the amplifier 802. In this example frequencies below 200Hz are blocked by a high pass filter 822 coupled with the input audio data 804 so that a frequency band of 0.2 to 1.6 kHz is acted on by the first processor 808. A comparison module 824 calculates a comparison metric, which provides a measure of the relationship between the playback and feedback powers. The comparison metric may be a ratio of the powers, or a measure derived therefrom. The comparison module may also derive an error calculation based on the comparison metric. A logic unit 826 then provides an excursion attenuation output 828 for adjusting the equalizer. This may be achieved for example by adjusting a variable gain amplifier 830 forming part of the equalizer circuit.

The frequency limit(s) of the filters 814, 816 may be chosen to be a limit that provides a suitable safety cap to account for the possible increase of the loudspeaker's resonant frequency due to long term effects such as aging and temperature variations. In the specific example used here for illustration, the loudspeaker has a resonant frequency in the region between 550-950 Hz under normal operating conditions, so 1.6 kHz represents a suitable safe limit.

The second processor 810 comprises a first band pass filter 818 that filters the digital output derived from the playback audio 804 and a second band pass filter 820 that filters the current and voltage measurements 811, 812 from the amplifier 802. In this example the band pass filters 818, 820 define a 2kHz to 4kHz range of frequencies which are acted on by the second processor 810. A comparison module 832 calculates a comparison metric, which provides a measure of the relationship between the playback and feedback powers. The comparison metric may be a ratio of the powers, or a measure derived therefrom. The comparison module may also derive an error calculation based on the comparison metric. An averaging unit 834 may be provided that operates on the output of the provides an overheating attenuation output 838 for adjusting the equalizer. This may be achieved comparison module to provide a smoothed input for a logic unit 836. The logic unit 836 then for example by adjusting a variable gain amplifier 840 forming part of the equalizer circuit The frequency limit(s) of the filters 818, 820 may be chosen such that the loudspeaker's impedance in the range is equivalent to the nominal loudspeaker DC resistance.

FIG. 8 also illustrates an example of a two band equalizer circuit for applying the respective attenuations to the audio signal. Excursion related attenuation is only applied to the lower frequencies while the overheating attenuation is applied to the whole audio spectrum. This is achieved by using one low pass filter 842 whose output is initially subtracted from the original audio signal 804 and then added back to the rest of audio spectrum after its modification (typically attenuation) from the first processor 808. Finally, the overheating protection attenuation is applied at the resulting signal before it is sent to the amplifier 802 to drive the loudspeaker 800.

In this example the excursion power ratio is not averaged, in contrast to overheating power ratio, since it is a relatively fast evolving phenomenon. This approach minimizes the delay of the ratio calculations that feeds the excursion related iterative control logic.

FIGS. 9-13 illustrate various results and readings for a loudspeaker, at room temperatures (20 degrees celcius).

Figure 9:
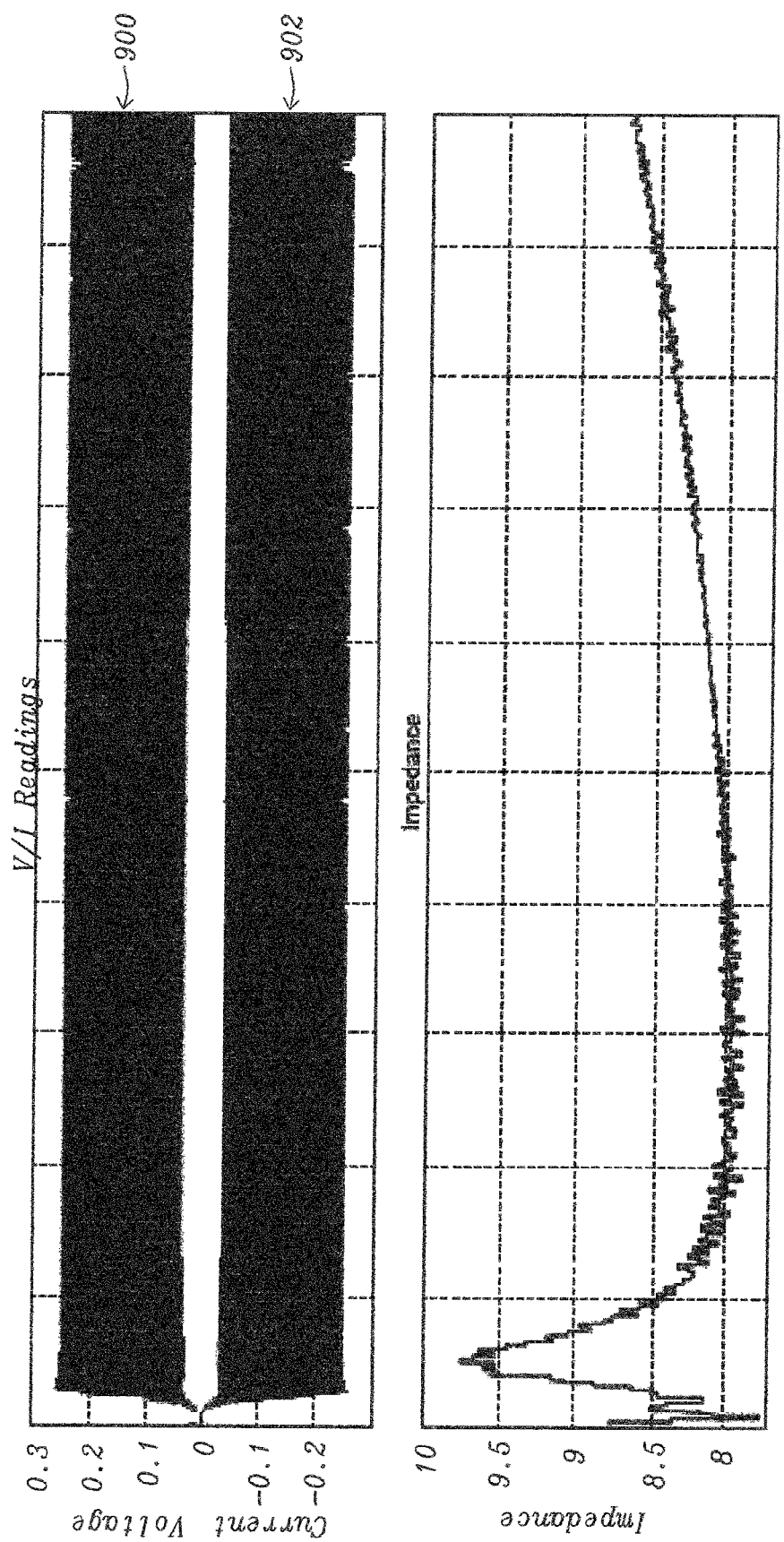
FIGS. 9-13 illustrate various results and readings for a specific loudspeaker.
Figure 10:
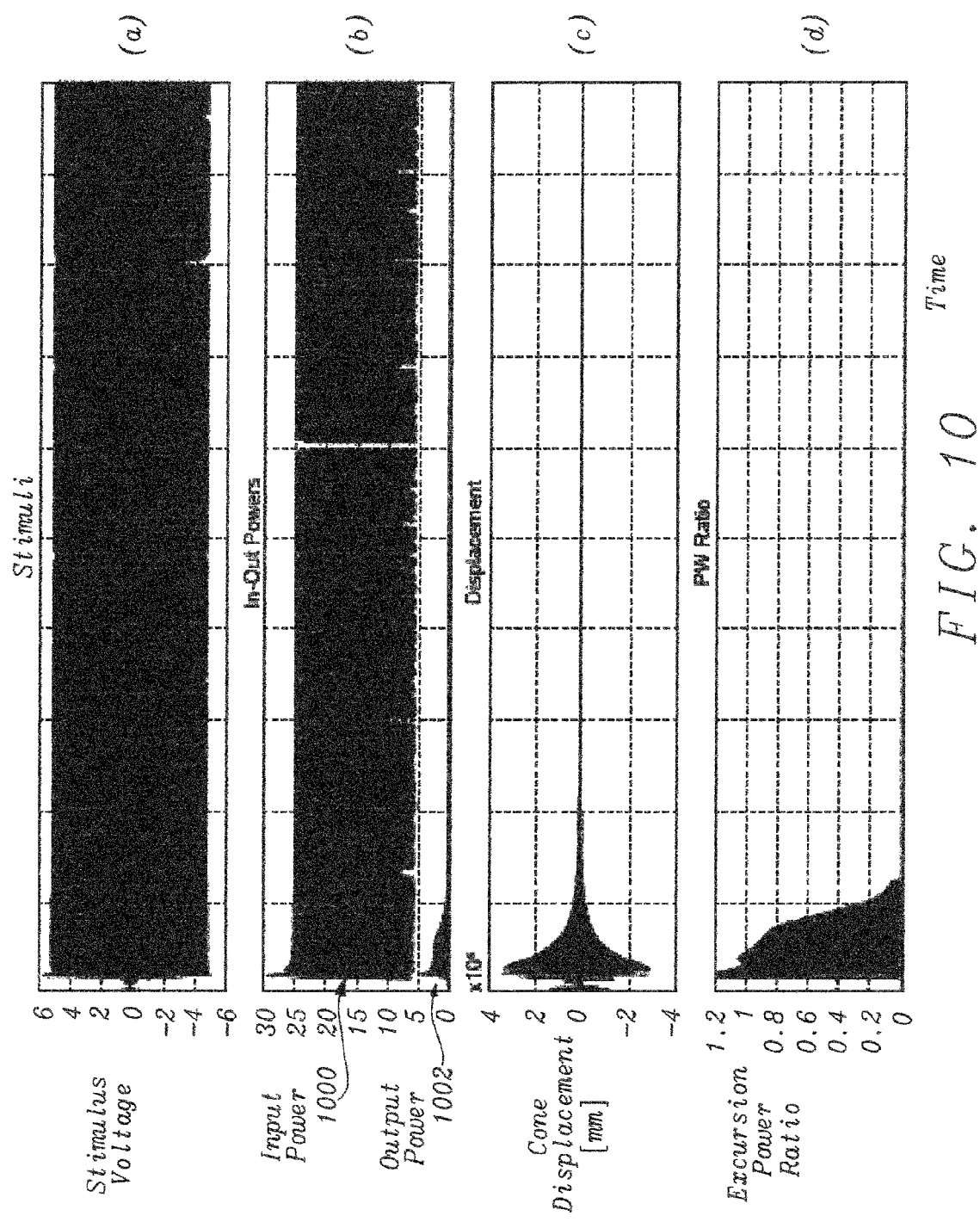
Figure 11:
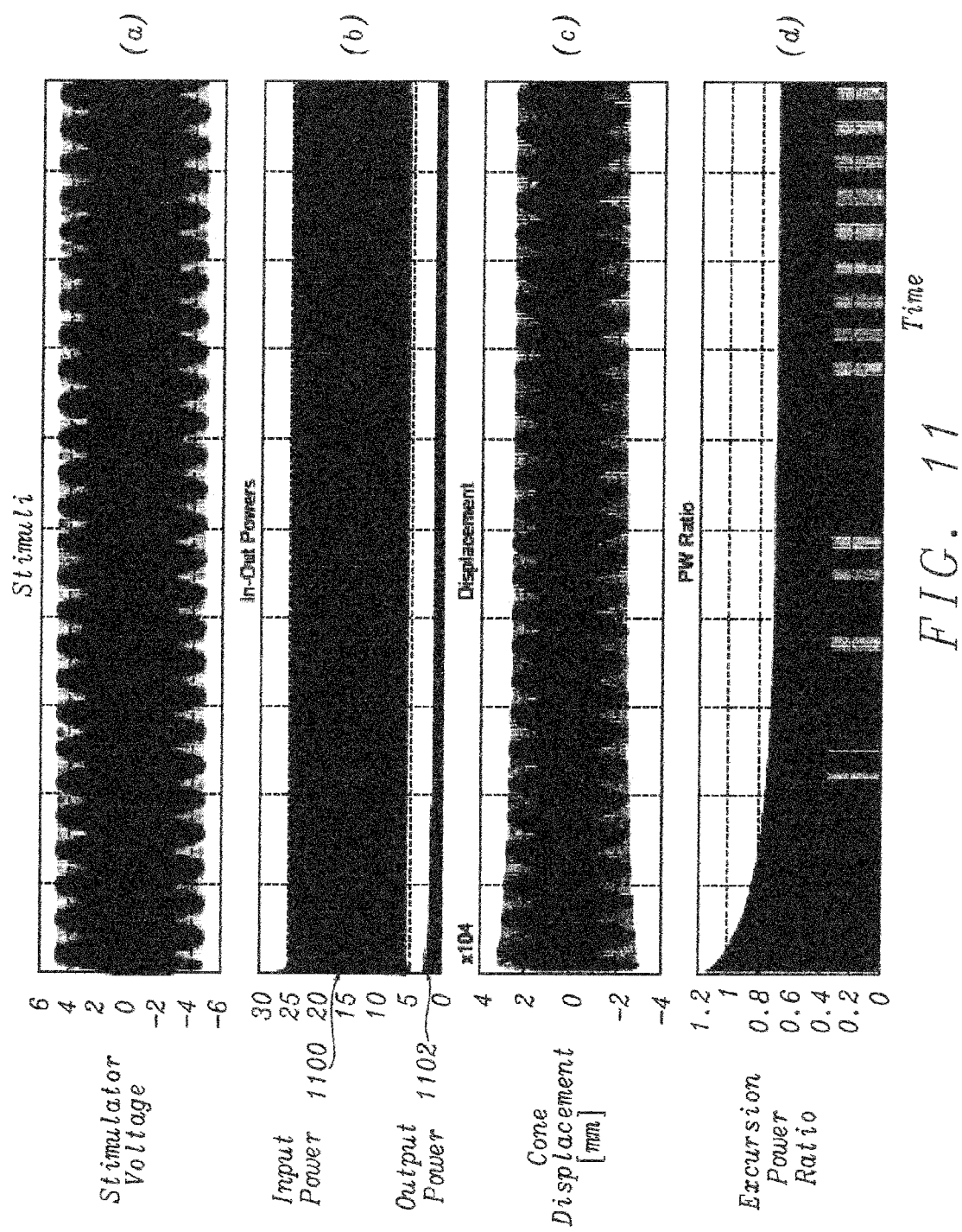
Figure 12:
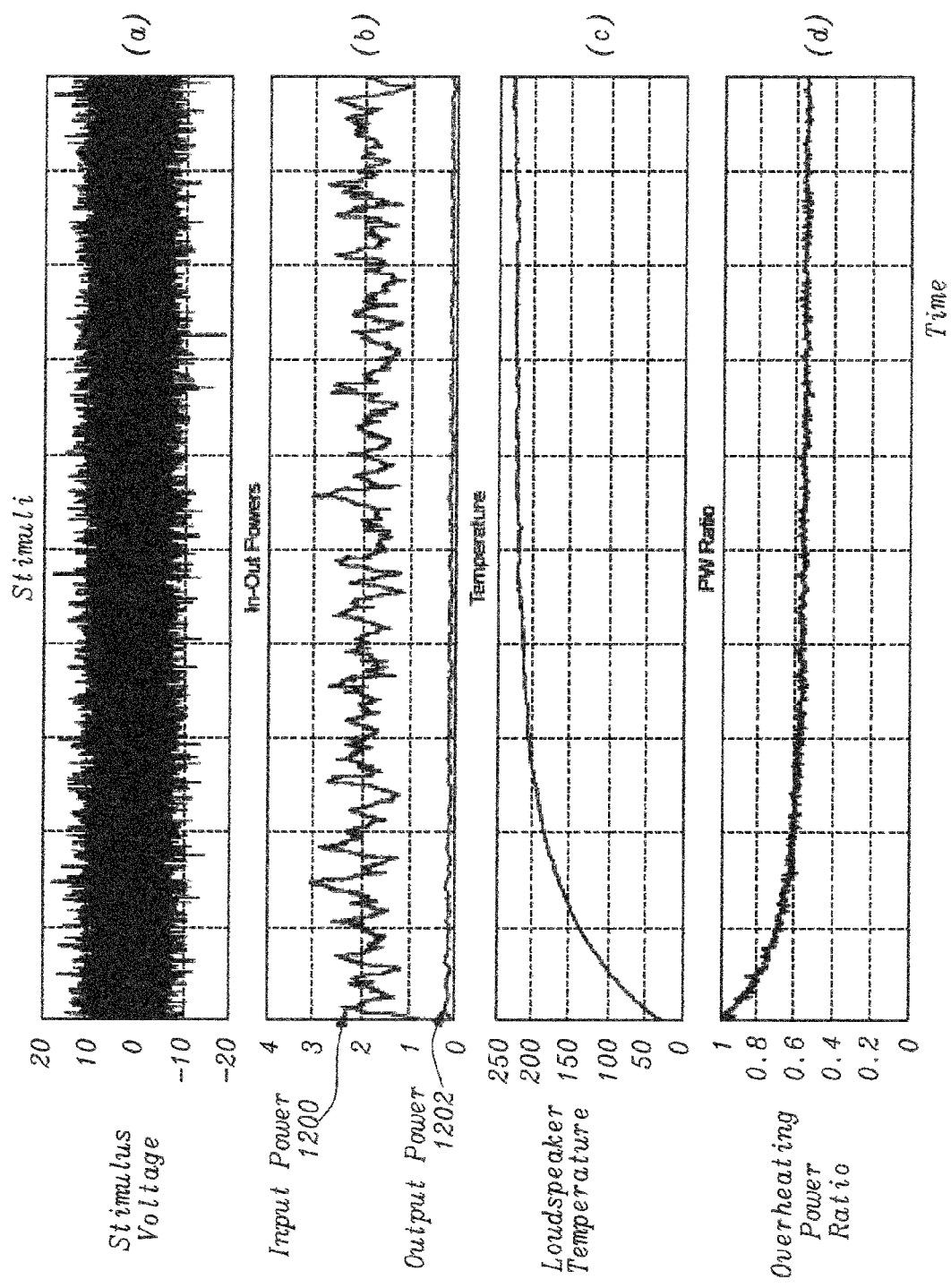
Figure 13:
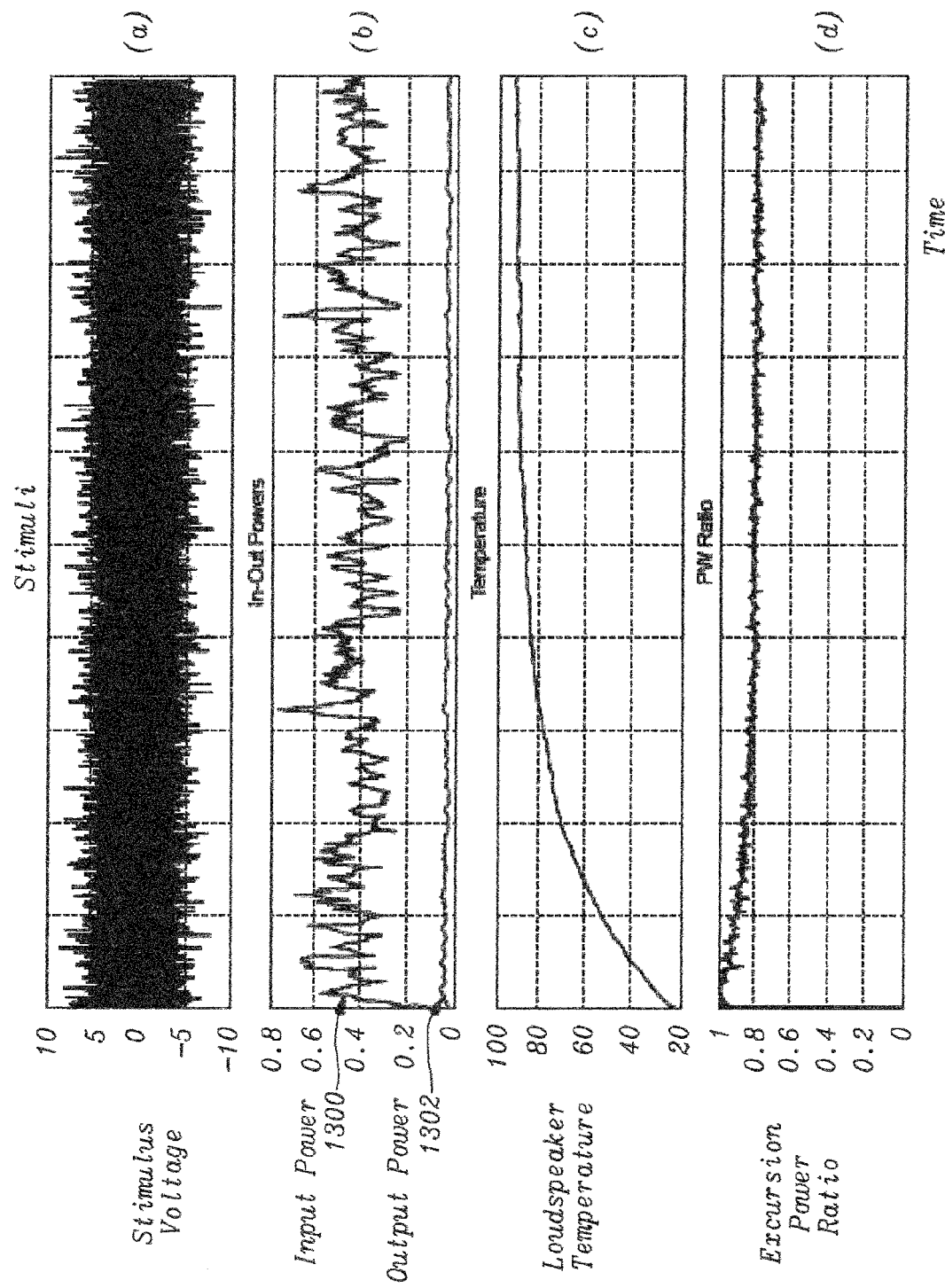

FIG. 9 shows the loudspeaker's impedance versus frequency (lower part), together with it voltage 900 and current 902 readings. As the temperature increases, the impedance also increases mainly due to the increase of its real-resistive component. This change can be tracked through the power ratio mentioned above.

The diagrams of FIGS. 10-13 show the variation of different parameters over time, for the embodiment of FIG. 8 used with a non-linear loudspeaker model.

FIG. 10a shows a stimulus voltage comprising an upwards linear frequency sweep from 50 Hz to 20 KHz with a 5V magnitude. FIG. 10b shows the variation of input power 1000 and output power 1002. FIG. 10c shows the variation of cone displacement (in mm), and FIG. 10d shows the excursion power ratio from 0.2 to 1.6 kHz.

FIG. 11a shows a stimulus voltage comprising a 500 Hz tone with 5 V magnitude. FIG. 11b shows the variation of input power 1100 and output power 1102. FIG. 11c shows the variation of cone displacement (in mm), and FIG. 11d shows the excursion power ratio from 0.2 to 1.6 kHz.

FIG. 12a shows a stimulus voltage comprising wideband noise with high gain. FIG. 12b shows the variation of input power 1200 and output power 1202. FIG. 12c shows the variation of loudspeaker temperature (in degrees Celsius), and FIG. 12d shows the overheating power ratio for the 2 kHz to 4 kHz sub band.

FIG. 13a shows a stimulus voltage comprising wideband noise with low gain. FIG. 13b shows the variation of input power 1300 and output power 1302. FIG. 13c shows the variation of loudspeaker temperature (in degrees Celsius), and FIG. 13d shows the excursion power ratio for the 2 kHz to 4 kHz sub band.

The present disclosure provides a dynamic and a real time method for loudspeaker frequency response equalization and adaptation through power driven measurements in N frequency bands, which can be fed to an N-band equalizer to manipulate the power levels according to predetermined thresholds.

Equalization can be achieved by utilizing the audio content being fed to the loudspeaker for playback, instead of specific audio signals or patterns.

By applying the above approach, it is possible to maintain loudspeaker performance at acceptable levels under various physical distortions, aging and environmental conditions. Additionally, the method is capable of preventing excursion and overheating conditions, which are strongly related to real power levels at low and mid-to-high frequency bands respectively. A speaker's lifetime can be lengthened while high quality performance is maintained.

The disclosure is able to prevent excursion conditions without requiring knowledge of the speaker's precise resonant frequency, which is advantageous as the resonant frequency can shift over time due to aging. This is feasible due to fact that the approach is also capable of monitoring the peaks of real power in the whole operational frequency range.

Additionally, the proposed method is able to prevent overheating conditions without requiring knowledge of the actual value of the speaker's voice coil DC resistance, since it relates the power difference determined (in various frequency bands) to voice coil temperature.

Various modifications and improvements can be made to the above without departing from the scope of the disclosure.

What is claimed is:

1. A loudspeaker driver circuit comprising:
   a first power calculator for determining a playback power from incoming audio data;
   a second power calculator for determining a feedback power from an actuator for driving the loudspeaker;
   a decision logic circuit arranged to calculate a ratio of the playback power and the feedback power, and to generate a command for adjusting a frequency response of the loudspeaker based on the ratio.

2. The loudspeaker driver circuit of claim 1, wherein the actuator comprises an amplifier.

3. The loudspeaker driver circuit of claim 1, comprising an equalizer which controls the actuator, and wherein the generated command comprises a gain factor or an attenuation factor for the equalizer.

4. The loudspeaker driver circuit of claim 1, wherein the first and second power calculator are arranged to determine playback power and feedback power for one or more specific frequency sub bands and the frequency response of the loudspeaker is adjusted for each individual sub band.

5. The loudspeaker driver circuit of claim 1, comprising a buffer for storing one or more playback and feedback power comparison results, and wherein the decision logic uses the stored results in combination with a later comparison result as the basis for adjusting the frequency response of the loudspeaker.

6. The loudspeaker driver circuit of claim 1, wherein the first power calculator comprises a power spectral density function calculator.

7. The loudspeaker driver circuit of claim 1, wherein the first power calculator comprises one or more band pass filters for extracting frequency content and a transformation module for transforming the frequencies to provide a power measurement for the or each frequency band.

8. The loudspeaker driver circuit of claim 1, wherein the second power calculator comprises a measurement device for measuring a current and a voltage across terminals of the actuator; and a calculator for multiplying the measured values to obtain a power measurement.

9. The loudspeaker driver circuit of claim 8, wherein the second power calculator comprises a set of band pass filters for filtering the current and/or voltage measurements taken by the measurement device.

10. The loudspeaker driver circuit of claim 1, wherein one or both of the playback power and the feedback power are smoothed before being compared with the other of the playback power and the feedback power.

11. The loudspeaker driver circuit of claim 1, wherein the loudspeaker is determined as being in an excursion condition if the feedback power is relatively high for one or a set of relatively low frequency sub bands.

12. The loudspeaker driver circuit of claim 1, wherein the loudspeaker is determined as being in an overheating condition if the feedback power is relatively low for one or a set of relatively high frequency sub bands.

13. The loudspeaker driver circuit of claim 1, wherein a first comparison threshold is defined for monitoring a loudspeaker excursion condition, a second comparison threshold is defined for monitoring a loudspeaker overheating condition; a first control signal adjusts the frequency response of a first set of frequency bands in response to the monitoring of the first comparison threshold, and a second control signal adjusts the frequency response of a second set of frequency bands in response to the monitoring of the second comparison threshold.

14. The loudspeaker driver circuit of claim 1, comprising a first processor for protection from loudspeaker excursion conditions and a second processor for protection from loudspeaker overheating conditions; where each of the first and second processors compares the playback and feedback powers for different frequency bands.

15. A method of operating a loudspeaker comprising:
    determining a playback power from incoming audio data;
    determining a feedback power from an actuator that drives the loudspeaker;
    calculating a ratio of the playback power and the feedback power; and adjusting a frequency response of the loudspeaker based on the ratio.

16. The method of claim 15, wherein the playback power and feedback power are determined for a specific frequency sub band and the frequency response of the loudspeaker is adjusted for that sub band.

17. The method of claim 15, wherein determining a feedback power from an actuator comprises measuring a current and a voltage across terminals of the actuator; and multiplying the measured values to obtain a power measurement.

18. The method of claim 15, wherein the loudspeaker is determined as being in an excursion condition if the feedback power is relatively high for one or a set of relatively low frequency sub bands.

19. The method of claim 15, wherein the loudspeaker is determined as being in an overheating condition if the feedback power is relatively low for one or a set of relatively high frequency sub bands.

20. The method of claim 15, wherein a first comparison threshold is defined for monitoring a loudspeaker excursion condition, a second comparison threshold is defined for monitoring a loudspeaker overheating condition; a first control signal adjusts the frequency response of a first set of frequency bands in response to the monitoring of the first comparison threshold, and a second control signal adjusts the frequency response of a second set of frequency bands in response to the monitoring of the second comparison threshold.

\* \* \* \* \*